US006921973B2

(12) United States Patent
Kataria et al.

(10) Patent No.: US 6,921,973 B2
(45) Date of Patent: Jul. 26, 2005

(54) ELECTRONIC MODULE HAVING COMPLIANT SPACER

(75) Inventors: Vijay Kataria, Kokomo, IN (US); Jacob A. Bednarz, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 43 days.

(21) Appl. No.: 10/348,495

(22) Filed: Jan. 21, 2003

(65) Prior Publication Data

US 2004/0140554 A1 Jul. 22, 2004

(51) Int. Cl.$^7$ .......................... H01L 23/10; H01L 23/34
(52) U.S. Cl. ................. 257/707; 257/713; 257/717
(58) Field of Search ................ 257/706, 707, 257/712, 713, 717–720; 438/117, 122, 125

(56) References Cited

U.S. PATENT DOCUMENTS

| | | | |
|---|---|---|---|
| 5,184,211 A | * | 2/1993 | Fox ........................... 257/706 |
| 5,373,104 A | | 12/1994 | Brauer ...................... 174/52.1 |
| 5,444,295 A | | 8/1995 | Lake et al. ................. 257/678 |
| 6,359,335 B1 | * | 3/2002 | Distefano et al. ........... 257/707 |

* cited by examiner

Primary Examiner—Hung Vu
(74) Attorney, Agent, or Firm—Stefan V. Chmielewski

(57) ABSTRACT

The present invention provides for an electronic control module including a support board, an electronic package, and a compliant spacer disposed between the electronic package and the support board. The compliant spacer may include a compliant rubber spacer having a hollow section. A heat sink member is thermally coupled to the electronic package.

18 Claims, 2 Drawing Sheets

ELECTRONIC MODULE HAVING COMPLIANT SPACER

TECHNICAL FIELD

The present invention generally relates to the packaging of electronic modules and, more particularly, to modules containing at least one electronic package mounted on a circuit board and thermally coupled to a heat sink.

BACKGROUND OF THE INVENTION

Electronic packages generally contain fabricated electrical circuitry including electronic components, such as transistors and resistors, that conduct electrical current. The electrical current, in turn, generates thermal energy (i.e., heat) within the electronic package. Excessive heat build up within the electronic package may lead to adverse affects including circuit failure. Thus, it is desirable to prevent excessive heating of some electronic packages. To do so, some electronic packages employ a thermal tab that may be thermally coupled to a heat sink to dissipate heat generated within the package(s).

Electronic control modules (ECMs) generally includes one or more electronic packages mounted onto a circuit board, such as a printed circuit board. The electronic packages have input/output electrical leads (pins) that connect to electrical circuits on or within the circuit board. In some conventional electronic control modules, the electronic packages are typically supported on a rigid support structure which, in turn, is engaged with the circuit board. Additionally, the heat sink is generally thermally coupled to the thermal tab of the electronic package to dissipate heat generated within the electronic package. Some conventional techniques for dissipating thermal energy (heat) from the package employ a heat sink supported against the package with clamps or directly places the heat sink on the printed circuit board with a hard, non-compliant, spacer to press the package against the thermally conducting heat sink.

In many conventional arrangements, the various electronic packages manufactured by different manufacturers typically do not have very close tolerances, despite the existence of international standards. This leads to variations in package size, and makes it difficult to design a universal spacer which is used to mount the various electronic packages with equal force on the circuit board. As a result of the use of conventional rigid spacers in conventional electronic control modules, excessive or insufficient pressure may be applied to the package(s) on the circuit board. This may cause variations in the gap between the heat sink and the thermal tab of the electronic package, which may result in particularly poor heat transfer for modules with larger gaps. Further, electronic packages having larger dimensions may crack or form an electrical short circuit with the heat sink, thereby causing the device to fail (malfunction). It has also generally been difficult to control the clamp force because of the variations in thickness of electrical devices from various manufacturers.

Accordingly, it is therefore desirable to provide for an electronic module which allows for various electronic packages to be connected to a circuit board and to be thermally coupled to a heat sink.

SUMMARY OF THE INVENTION

The present invention provides for an electronic module including a support board, an electronic package, a compliant spacer disposed between the electronic package and the support board, and a heat sink member thermally coupled to the electronic package. The compliant spacer is compressible and flexible. The compliant spacer advantageously compresses and flexes to provide adjustments for variations in dimensions of electronic packages, achieves a desired separation distance, and reduces stress caused by thermal expansion.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENT

Figure 1:
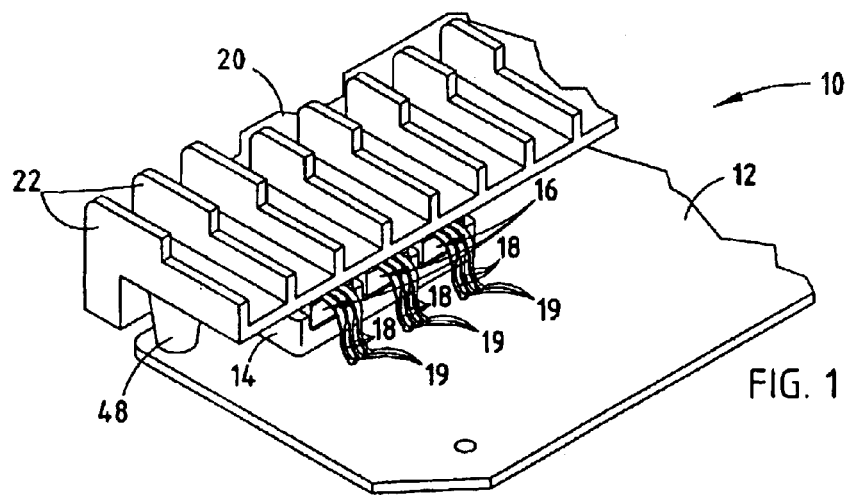
FIG. 1 is a perspective view of an electronic control module employing a compliant spacer between electronic packages and a circuit board.
Figure 2:
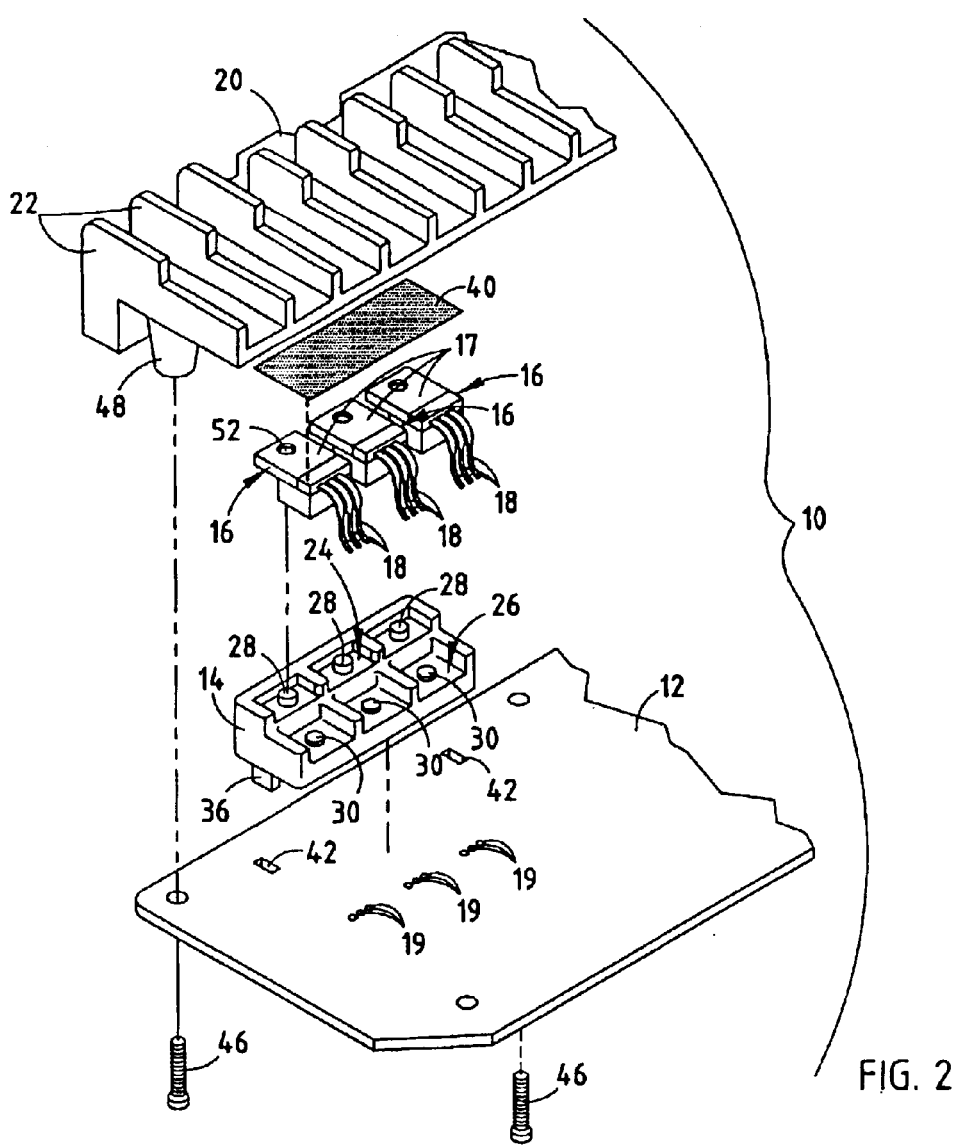
FIG. 2 is an exploded view of the electronic control module shown in FIG. 1.

Referring to FIGS. 1 and 2, a portion of an electronic control module (ECM) 10 is generally illustrated employing a compliant spacer 14 according to the present invention. The portion of electronic control module 10 shown and described herein includes three electronic packages 16 mounted on a circuit board 12. The electronic packages 16 include electronic circuitry, such as control circuitry, and are electrically and physically coupled to the circuit board 12. While three electronic packages 16 are shown and described herein, it should be appreciated that the electronic control module 10 may include any number of one or more electronic packages 16.

The compliant spacer 14 is disposed between each of the electronic packages 16 and the circuit board 12, according to the present invention. Mounted on top of the electronic packages 16 is a heat sink 20 in thermally conductive relationship with the electronic packages 16. The heat sink 20 includes a plurality of upstanding cooling fins 22, generally made of a thermally conductive material, such as copper or aluminum, for transferring thermal energy received from the electronic packages 16 to the surrounding environment of the heat sink 20. The cooling fins 22 provide a large surface area for dispersing the thermal energy to a fluid (e.g., air) in the surrounding environment by way of convection.

It should be appreciated that the electronic control module 10 may include a single or any multiple of electronic packages 16 mounted to the circuit board 12 and heat sink 20 via the compliant spacer 14, without departing from the teachings of the present invention. The electronic packages 16 generally have electrical circuitry including electronic circuit devices (components), such as integrated circuitry, intended to conduct electrical current. For example, the electronic components may include one or more transistors configured to provide a controlled switching operation, operate as a diode, or provide voltage regulation. When electrical current passes through the electronic circuitry in each of the electronic packages 16, thermal energy (heat) is typically generated within the package 16 due to electrical resistance. The electronic packages 16 each have a thermal tab 17 formed on the upper surface and in thermal relationship with the thermal energy generated within the electronic package 16. The thermal tab 17 may be made of a heat conducting material, such as copper or aluminum. The electronic control module 10 thermally couples the heat sink 20 to the electronic packages 16 to conduct the thermal energy away from the electronic packages 16 to the surrounding environment so as to prevent the excessive build up of thermal energy within the electronic control module 10.

One example of an electronic package 16 may include an industry standard TO220 package. Another example of an electronic package 16 may include an industry standard TO247 package. Both of the aforementioned electronic packages include electrical circuitry in a package having a thermal tab. The electronic packages 16 may perform any of a number of control functions and are commonly used in electronic control modules in a fluid environment.

The compliant spacer 14 and electronic packages 16 are sandwiched between the circuit board 12 and heat sink 20 via fasteners. The fasteners include screws (or bolts) 46 extending through circuit board 12 and threadingly engaging threaded sockets 48 in heat sink 20 to fasten the heat sink 20 in place relative to circuit board 12. The screws 46 are tightened to compress the compliant spacer 14 and electronic packages 16 between the heat sink 20 and circuit board 12.

Additionally, the upper surface of the thermal tab 17 of each of electronic packages 16 is adhered to the lower surface of heat sink 20 via a thin layer of thermally conductive adhesive 40. The thermally conductive adhesive 40 maintains a substantially constant thickness between the electronic packages 16 and the heat sink 20 and maintains the thermal conduction between the electronic package 16 and the heat sink 20. In addition to adhesion, the thermally conductive adhesive 40 conducts thermal energy from the thermal tab 17 of the electronic packages 16 to the heat sink 20. One example of a thermally conductive adhesive 40 may include 1-4174 Primerless Silicone Adhesive, commercially available from Dow Corning Corporation.

The circuit board 12 may include any of a number of circuit boards having electrical circuit paths. According to one example, circuit board 12 may include a printed circuit board (PCB) having printed circuitry as is generally known in the art. According to another example, circuit board 12 may include a wiring board. It should be appreciated that the electrical leads 18 of electronic packages 16 pass through conductive vias 19 in circuit board 12 and electrically connect to electrical circuitry (not shown) formed on or within the circuit board 12.

Figure 3:
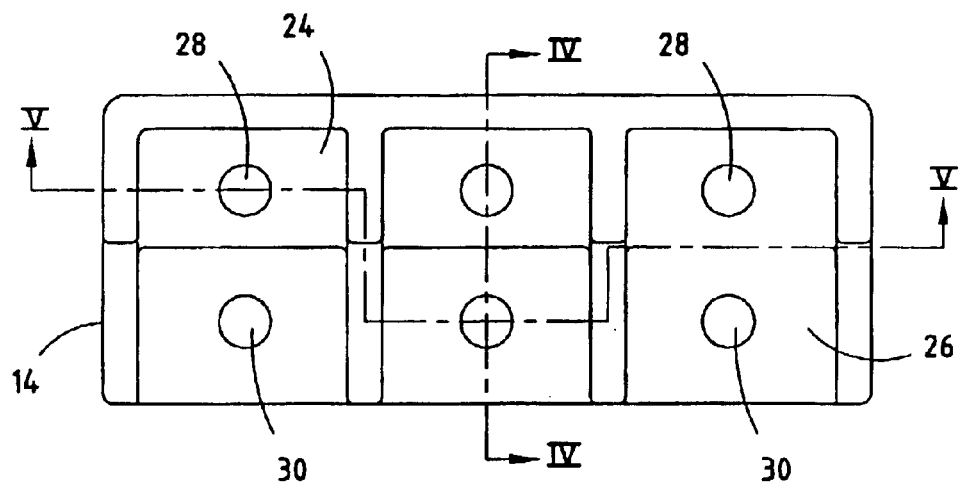
FIG. 3 is a top view of the compliant spacer employed in the electronic control module of FIG. 1.

The compliant spacer 14 employed in accordance with the present invention is a compressible and flexible rubber spacer which serves for mounting the electronic packages 16 onto circuit board 12 and maintaining the electronic packages 16 in heat conducting relationship with heat sink 20. The compliant spacer 14 also serves as a gap pad to provide a substantially constant distance via adhesive 40 between the electronic packages 16 and heat sink 20. The compliant spacer 14, as best seen in FIGS. 2 and 3, includes a plurality of upper receptacles including three forward receptacles 26 and three rear receptacles 24, designed such that each pair of forward and rearward receptacles 26 and 24 receives one of the electronic packages 16. Within each of the forward receptacles 26 are upstanding posts 30. Likewise, within the rear receptacles 24 are upstanding posts 28 which engage openings 52 in electronic packages 16. The engagement of posts 28 within openings 52 allows for easy alignment of the electronic packages 16 on top of the compliant spacer 14.

The compliant spacer 14 is made of a compressible and flexible material that is resilient to return to its precompressed shape and may include silicon rubber, according to one embodiment. The compliant spacer 14 is able to expand and contract. The compliant spacer 14 is flexible in that the spacer 14 has a hardness of less than eighty (80) durometer, as measured with a durometer. According to one embodiment, the compliant spacer 14 has a hardness of less than fifty (50) durometer, and more specifically a hardness in the range of twenty-five (25) to forty-five (45) durometer. In one embodiment, the compliant spacer 14 has a hardness of about thirty-five (35) plus or minus two (±2) durometer. Upon expanding the compliant spacer 14 exerts a lessened force as compared to a rigid spacer, and also some of the force applied to the compliant spacer 14 is deflected laterally. The use of a silicon rubber for the spacer 14 provides for a high percentage of compression set during its life cycle, so that with each thermal cycle expansion, the rubber takes some set and exerts less pressure next time, thus minimizing further stress.

Figure 4:
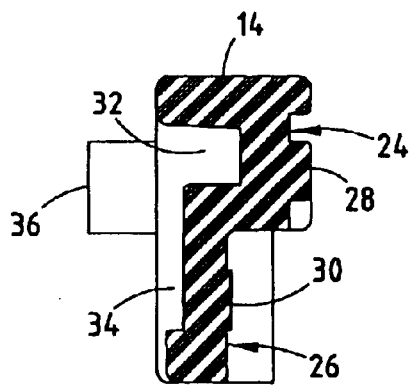
FIG. 4 is a cross-sectional view taken through lines IV—IV of the spacer in FIG. 3.

Referring to FIG. 4, the compliant spacer 14 is further shown having a hollow section including a first compression cavity 34 and a raised second compression cavity 32 formed in the lower surface. An electronic package 16 rests on top of the upper receptacles 26 and 24 with the heat sink 20 compressed on top of the electronic package 16. When the compliant spacer 14 is compressed between the heat sink 20 and the circuit board 12, the first and second compression cavities 34 and 32 allow the compliant spacer 14 to compress and move laterally. If the rubber compliant spacer 14 expands based on temperature, excessive force may be deflected laterally.

Figure 5:
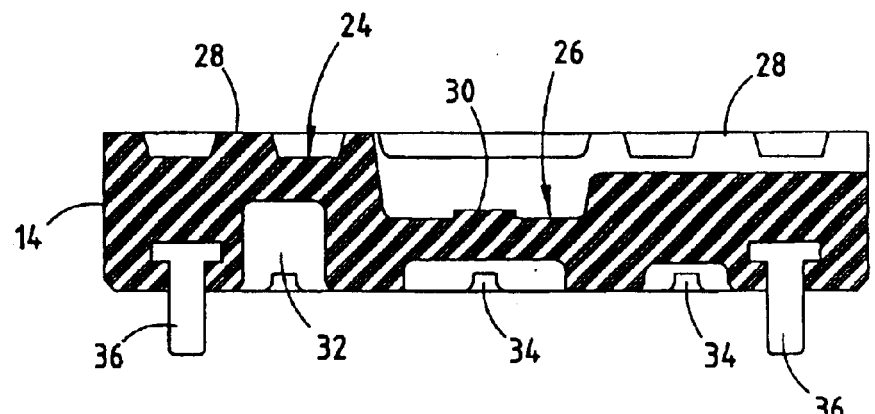
FIG. 5 is a cross-sectional view taken through lines V—V of the spacer in FIG. 3.

Referring to FIG. 5, the individual compression cavities 34 and 32 are further shown formed below each of the three electronic packages 16. Also shown are male members (pegs) 36 which extend downward and are intended to engage openings 42 in the upper surface of the circuit board 12 so as to allow for alignment of the compliant spacer 14 on circuit board 12.

Accordingly, the use of the compliant spacer 14 to mount electronic packages 16 between a circuit board 12 and a heat sink 20 is provided. The compliant spacer 14 advantageously adjusts to variations in dimensions of the electronic packages 16, and maintains a substantially equal distance of the thermal tab 17 from the heat sink 20 while effectively deflecting excessive pressure. The rubber material selected for the compliant spacer 14 has a high percentage of compression set which helps in reducing the stresses caused by a high coefficient of thermal expansion (CTE), during temperature cycles when the rubber material gets a permanent set, thereby reducing the stresses. The present invention further prevents shorts due to the compliant back support and improves the heat transfer capability due to a uniform adhesive thickness.

It will be understood by those who practice the invention and those skilled in the art, that various modifications and improvements may be made to the invention without departing from the spirit of the disclosed concept. The scope of protection afforded is to be determined by the claims and by the breadth of interpretation allowed by law.

What is claimed is:

1. An electronic module comprising:
   a support board;
   an electronic package comprising electrical leads and electronic circuitry electrically and physically coupled to the support board;
   a compliant spacer disposed between the electronic package and the support board, wherein the compliant spacer comprises a hollow section; and
   a heat sink member thermally coupled to the electronic package.

2. The electronic module as defined in claim 1, wherein the compliant spacer has a hardness of less than 80 durometer.

3. The electronic module as defined in claim 1, wherein the compliant spacer comprises rubber.

4. The electronic module as defined in claim 3, wherein the compliant spacer comprises a silicon rubber.

5. The electronic module as defined in claim 1 further comprising a thermally conductive adhesive adhering the heat sink member to the electronic package.

6. The electronic module as defined in claim 1, wherein the electronic package comprises a thermal tab in thermally conducting relationship with the heat sink member.

7. The electronic module as defined in claim 1, wherein the support board comprises a circuit board.

8. The electronic module as defined in claim 7, wherein the circuit board comprises a printed circuit board.

9. The electronic module as defined in claim 1, wherein the electronic package comprises at least one transistor.

10. The electronic module as defined in claim 1, wherein the electronic package has control circuitry to form an electronic control module.

11. An electronic control module comprising:
    a circuit board;
    an electronic package comprising electrical leads and electronic circuitry electrically and physically coupled to the circuit board;
    a compliant spacer disposed between the electronic package and the circuit board, wherein the compliant spacer comprises a hollow section; and
    a heat sink member thermally coupled to the electronic package.

12. The electronic control module as defined in claim 11, wherein the compliant spacer has a hardness of less than 80 durometer.

13. The electronic control module as defined in claim 11, wherein the compliant spacer comprises rubber.

14. The electronic control module as defined in claim 13, wherein the compliant spacer comprises a silicon rubber.

15. The electronic control module as defined in claim 11 further comprising a thermally conductive adhesive adhering the heat sink member to the electronic package.

16. The electronic module as defined in claim 11, wherein the electronic package comprises a thermal tab in thermally conducting relationship with the heat sink member.

17. The electronic control module as defined in claim 11, wherein the circuit board comprises a printed circuit board.

18. The electronic control module as defined in claim 11, wherein the electronic package comprises at least one transistor.

* * * * *